United States Patent
Nagayama et al.

(10) Patent No.: US 6,674,078 B2
(45) Date of Patent: Jan. 6, 2004

(54) DIFFERENTIAL CONTRAST TRANSMISSION ELECTRON MICROSCOPE AND METHOD OF PROCESSING DATA ABOUT ELECTRON MICROSCOPE IMAGES

(75) Inventors: Kuniaki Nagayama, 2-5-1-13, Tatsumi-Minami, Okazaki, Aichi 444-0874 (JP); Radostin S. Danev, Aichi (JP)

(73) Assignees: Jeol Ltd., Tokyo (JP); Kuniaki Nagayama, Okazaki (JP)

( * ) Notice: Subject to any disclaimer, the term of this patent is extended or adjusted under 35 U.S.C. 154(b) by 0 days.

(21) Appl. No.: 10/255,163

(22) Filed: Sep. 25, 2002

(65) Prior Publication Data

US 2003/0066964 A1 Apr. 10, 2003

(30) Foreign Application Priority Data

Sep. 25, 2001 (JP) .......................................... 2001-290860

(51) Int. Cl.[7] ................................................ H01J 37/26
(52) U.S. Cl. ........................ 250/311; 250/306; 250/307; 356/128; 356/904
(58) Field of Search ................................. 250/311, 306, 250/307; 356/128, 904

(56) References Cited

U.S. PATENT DOCUMENTS

2002/0086317 A1 * 7/2002 Nagayama ...................... 435/6
2002/0148962 A1 * 10/2002 Hosokawa et al. ........... 250/311
2003/0132383 A1 * 7/2003 Benner ......................... 250/311

FOREIGN PATENT DOCUMENTS

JP      2110-273866      *    5/2001

OTHER PUBLICATIONS

"Experiment on the Electron Phase Microscope", Kōichi Kanaya et al., *Journal of Applied Physics*, vol. 29, No. 1, pp. 1046–1051, Jul. 1958.
"High Resolution Electron Microscopy With Profiled Phase Plates", D. Willasch, *Optik*, vol. 44, No. 1, pp. 17–36 (1975).

* cited by examiner

Primary Examiner—John R. Lee
Assistant Examiner—James J. Leybourne
(74) Attorney, Agent, or Firm—Webb Ziesenheim Logsdon Orkin & Hanson, P.C.

(57) ABSTRACT

Phase manipulation is used to produce a high contrast electron microscope image. A phase plate is placed at the back focal plane of an objective lens and used to form a differential contrast image.

9 Claims, 13 Drawing Sheets

DIFFERENTIAL CONTRAST TRANSMISSION ELECTRON MICROSCOPE AND METHOD OF PROCESSING DATA ABOUT ELECTRON MICROSCOPE IMAGES

BACKGROUND OF THE INVENTION

1. Field of the Invention

The present invention relates to an electron microscope and, more particularly, to a technique that achieves performance comparable to that of a differential interference contrast method in visible light microscopy by forming interfering phases of electrons using a phase plate. This technique permits contrast improvement of electron microscope images and three-dimensional topographical imaging that is a novel method of representation. The invention also relates to a method using this technique.

2. Description of Related Art

Generally, there are four kinds of transmission microscopy that are fundamentally different in imaging method, i.e., a) bright field microscopy, b) dark field microscopy, c) phase contrast microscopy, and d) differential interference contrast microscopy.

Only bright field microscopy, dark field microscopy, and phase contrast microscopy have been realized in transmission electron microscopy for the following reason. In visible light microscopy, complex operations (i.e., splitting into two incident waves and recombination of the waves transmitted through a specimen) have been performed on incident waves in a real space. It is considered that it is technically difficult for the existing electron optical lens system to perform these complex operations. It is known that Schlieren technology is close to differential interference contrast microscopy and consists of inserting a field of view-cutting semicircular aperture into the focal plane behind the objective lens. This technology is also known as single-sideband holography (L. Reimer, *Transmission Electron Microscopy: Physics of Image Formation and Microanalysis*, Ed. 4, Springer, N.Y., 1997). However, this has not been used because half of the spatial-frequency components are discarded and because the resulting image is complex to interpret.

Differential interference contrast microscopy is used in visible light microscopy to topographically image variations in the phases of incident waves caused by a transparent specimen. The difference between the phase contrast microscopy used for a transparent specimen and differential interference contrast microscopy is that images not phases but their derivatives (which ought to be referred to as differences because they are differences in finite displacements) are used. Therefore, two Wollaston prisms are placed on the opposite sides of a specimen. The incident waves are split by the first prism into two beams slightly laterally displaced. After transmission through the specimen, the second prism recombines the two transmitted beams into one on the same optical axis, and the resulting interference is detected. Consequently, the lateral difference of the phase variation (phase difference) due to the specimen is converted into an intensity image. Thus, imaging is achieved.

Where the specimen is thin, the electron beam is little absorbed and almost fully transmitted. That is, it can be considered that what are treated by an electron microscope are transparent specimens. For this reason, the imaging method intrinsic to electron microscopy should be phase contrast microscopy or differential interference contrast microscopy, but neither of them are used today. With respect to the former technology, the principle is understood but the phase plate suffers from the problem of charging effects. On the other hand, where the latter technology is employed, if it is attempted to do work similar to the work done by the aforementioned real-space microscopy technique, it is necessary to combine biprisms and deflectors in a complex manner. Hence, it has been difficult to achieve a simple setup for electron microscopy unlike visible light optics.

SUMMARY OF THE INVENTION

Various operations in a real space can be often replaced by operations in a k-space, i.e., operations on the phases of electron waves at the back focal plane (diffraction plane) of an objective lens, if contrivances are made. One example is installation of a Zernike phase plate at the back focal plane (Japanese Patent Application No. 2000-85493 filed by Nagayama and Danev). Of course, in order that such operations are performed smoothly, the back focal plane is restricted to a point light source illumination system capable of clearly defining a back focal plane. As long as these conditions are met, achievements similar to those achieved by the differential interference contrast microscopy can be accomplished by installing a novel phase plate (i.e., a semicircular phase plate that blocks half of the field of view at the focal plane). This phase plate delays the phases of incident waves by $\pi$. Preferably, the phase plate is made of a thin amorphous film using a light element that shows a small degree of scattering. Examples include a film of amorphous carbon, a film of amorphous aluminum, and a film of amorphous silicon.

This is described in further detail by referring to the accompanying drawings. First, the phase plate is placed at the back focal plane (Pb) of an objective lens placed in a transmission electron microscope as shown in FIG. 11. Where incident electrons emerging from a point source do not provide strictly parallel illumination immediately ahead of the objective lens, the focus of the incident waves (the circle of least confusion) is shifted above or below the focal plane. In this case, a moving mechanism is necessary to move the phase plate holder into the focal point. The following description is given on the assumption that this moving mechanism is present.

FIG. 1 shows a semicircular phase plate according to the present invention. Normally, the phase plate inserted into the back focal plane (Pb) of the objective lens shown in FIG. 11 assumes a contour as shown in FIG. 1. The semicircular phase plate, indicated by numeral 1, consists of a thin film placed on a circular phase plate support 2. The semicircular plate 1 and the phase plate support 2 are collectively referred to as the phase plate assembly. It is assumed that the thin film of the phase plate 1 overlies the phase plate support 2.

FIG. 2a shows a plan view and FIG. 2b a side elevation of the phase plate assembly. FIG. 2a of the phase plate assembly is taken from above. The semicircle occupied by the phase plate assembly is referred to as the phase plate semicircle. The remaining semicircle is referred to as the semicircular opening. Transmitted, incident waves are brought to a focus at a point 3 through which the optical axis passes. This point is the zeroth-order diffraction point, and an adjustment is always made to place this point on the side of the semicircular opening. A side elevation of the phase plate assembly is shown in FIG. 2b. The relative arrangement of the two components of the phase plate assembly can be seen from FIGS. 2a and 2b.

FIG. 3 shows the system of coordinates of the diffraction plane (focal plane) depending on the semicircular phase plate. A system of coordinates as shown in FIG. 3 is established around the phase plate assembly for correspondence with expansion of the theory. The focal point (zeroth-order diffraction point) of transmitted, incident waves is taken at the origin. Coordinate axes ($k_x$, $k_y$) corresponding to a Fourier-transformed k-space are placed on the focal plane as shown. The semicircular phase plate covers the half plane on the side $k_x < 0$ as shown in FIG. 3. Note that $k_x$ and $k_y$ are x- and y-components, respectively, of two-dimensional spatial frequency vector κ. The vector κ is correlated with a real vector r on the focal plane by the following relational equation.

$$\kappa = \frac{r}{\lambda f} \quad (1)$$

where λ is the wavelength of electron waves and $f$ is the focal distance of the objective lens.

If electron waves pass through a thin film having a uniform thickness and uniform composition, the phases of the waves are shifted according to the following formula (D. Willasch, *Optic* 44 (1975) 17):

$$\phi = -\frac{\pi(h/\lambda)(V/U_0)(1+2\alpha U_0)}{(1+\alpha U_0)} \quad (2)$$

where h is the thickness of the thin film of the phase plate, V is the internal potential of the thin-film material, $U_0$ is the accelerating voltage, and α is a constant ($=0.9785 \times 10^{-6} V^{-1}$).

In FIG. 3, when the optical axis is brought infinitely close to the edge of the thin film, the action of the phase plate is represented by $$\left\{ \begin{array}{ll} \exp(i\phi), & k_x < 0 \\ 1, & k_x \geq 0 \end{array} \right\} \quad (3)$$

where exp (iφ) is applied to half plane of the k-space image of scattering waves. If a weak object that causes small variations in amplitude and phase is used as the specimen, almost every entering wave passes through the focal point 3 without being scattered. The effects of the phase plate assembly appear as modulation of the amplitude and phase due to the following contrast transfer functions (CTFs):

amplitude CTF: $2 \cos [\gamma(|\kappa|) + \phi/2] \exp(-i \, \text{sgn}(k_x) \phi/2)$ (4)

phase CTF: $-2 \sin [\gamma(|\kappa|) + \phi/2] \exp(-i \, \text{sgn}(k_x) \phi/2)$ (5)

where sgn ($k_x$) is a signum function, and we have sgn ($k_x$)=1 ($k_x \geq 0$) and sgn ($k_x$)=−1 ($k_x < 0$). $\gamma(|\kappa|)$ is a phase delay caused by the spherical aberration of the objective lens and by defocus. The phase delay is dependent on the spatial frequency and given by the following formula (L. Reimer):

$$\gamma(|\kappa|) = 2\pi \left( -\frac{\lambda \Delta Z k^2}{2} + \frac{\lambda^3 C_s k^4}{4} \right) \quad (6)$$

where $C_s$ is the spherical aberration coefficient and ΔZ is the defocus.

Where the phase plate is removed (φ=0 in Eq. (3)), the above-described Eqs. (4) and (5) are, respectively, given by amplitude CTF: $2 \cos \gamma(|\kappa|)$ (7)

phase CTF: $-2 \sin \gamma(|\kappa|)$ (8)

It follows that CTFs appearing in normal electron microscopy are obtained.

Especially, in the case of an extremely thin specimen, little amplitude variation occurs and so the phase CTF is applied to the phase component and converted into an intensity image, which is observed. In normal electron microscopy, this sine-type CTF has presented various problems including low contrast and modulation of the image.

With respect to φ, the case where φ=−π is especially important in specific applications. By inserting φ=−π into Eqs. (4) and (5) gives rise to exp (i sgn ($k_x$)π/2) =i sgn ($k_x$). Therefore, Eqs. (4) and (5) are, respectively, simplified into the forms:

amplitude CTF: $i \, 2 \, \text{sgn}(k_x) \sin \gamma(|\kappa|)$ (9)

phase CTF: $i 2 \text{sgn}(k_x) \cos \gamma(|\kappa|)$ (10)

This is illustrated in FIGS. 4a and 4b, which depict the results of simulations of the contrast transfer functions (CTFs) of a differential contrast microscope where the phase delay of the semicircular phase plate is π, the defocus is 0, and the accelerating voltage is 300 kV. FIG. 4a indicates the CTF applied to the amplitude, while FIG. 4b indicates the phase CTF applied to phase components.

Compared with the CTFs (Eqs. (7) and (8)) of normal electron microscopy, three distinct features are observed. The first one is that the corresponding relations with the sine function and cosine function are exchanged and $\cos \gamma(|\kappa|)$ appears in the phase CTF. The second one is that the signum function sgn ($k_x$) is applied. As a result, the amplitude and phase CTFs which are intrinsically even functions are converted into odd functions. The third one is that the imaginary unit i is applied. The first feature means that the image contrast in the phase object is improved, because the phase CTF is the same contrast transfer function as a phase contrast image. The third feature is not intrinsic. It is a factor for obtaining a real function in a Fourier-transformed real space. An important feature appears as the second feature. CTFs which were even functions are changed into odd functions. This can lead to a differential contrast image. This is hereinafter described in detail.

Eq. (10) is approximated by the sum of two rectangular functions: $(-\Pi(k_x/k_c + \frac{1}{2}) + \Pi(k_x/k_c - \frac{1}{2}))$. FIGS. 5a and 5b represent the differential contrast where this approximate phase CTF is used. The phase CTF of FIG. 4b is approximated by two rectangular functions (Π(x)) having opposite signs. The frequency of the first zero point in FIG. 4b is made to correspond to $k_c$. Because signals appearing in the range given by $|\kappa| > k_c$ are averaged out to zero in the original function by fast vibrational modulation occurring in this range, $|\kappa| > k_c$ is set to 0.

FIG. 5b is the Fourier transform of the rectangular function (FIG. 5a) of the opposite sign used for the approximation and given by $$\frac{i(\sin \pi k_c x)^2}{\pi k_c x} \quad (11)$$

The Fourier transform of a CTF acting on phase components gives a point spread function of a real-space image. Therefore, FIG. 5b indicates a point spread function, i.e., the degree of blurring of an image when an infinitesimally small point forms an image. The action is equivalent to the case where the function of Eq. (11) is convolved to an ideal image of positive focus (which may be referred to as the original image) without aberration.

Eq. (11) can be rewritten into the form $\sin \pi k_c x \cdot \text{sinc} (\pi k_c x)$. The action of the first term $\sin \pi k_c x$ is to shift the sinc function (sinc $(\pi k_c x) = \sin \pi k_c x / \pi k_c x$) to the right and left, thus changing the sign. The result is the sum of two functions of opposite signs as can be seen from FIG. 5b. Eq. (11) can be represented in terms of the sum of δ functions which have opposite signs and are spaced apart by $1/k_c$. Thus, $$\delta\left(x + \frac{1}{k_c}\right) - \delta\left(x - \frac{1}{k_c}\right) \quad (12)$$

An actual image is the superimposition of its approximate formula (Eq. (12)) and the original image. It follows that their difference is created.

Specifically, this process is equivalent to shifting the original image to the left and right by $\frac{1}{2}k_c$ and taking the difference between them because they are opposite in sign. The displacement $\frac{1}{2}k_c$ will be determined from the position of the first zero point in the CTF of FIG. 4b. In practice, since it is the superimposition of sinc functions, the original image has a point spread determined by the functions and thus the resolution is limited.

The principle of a differential contrast microscope has been described thus far. The differential nature and the property that a phase CTF changes into cos γ(|κ|) (i.e., characteristic equivalent to the differential phase microscopy) are all derived from the fact that CTFs are converted into odd functions. The conversion to odd functions arises from the following formula that is a function form of a phase plate:

$$sgn(k_x) = \begin{cases} -1, & k_x < 0 \\ 1, & k_x > 0 \end{cases} \quad (13)$$

The property of this differential contrast microscopy is common with the differential interference contrast microscopy utilized in visible light microscopy in terms of the following two points: 1) the technology is differential microscopy, and 2) the CTF is the same as that of a phase difference image. Because of these features, the resulting image is a three-dimensional topographical representation as shown in FIGS. 8a–8f. Therefore, this technology may be referred to as differential interference contrast microscopy. However, the present invention adopts a totally new method consisting of performing operations on phases in a k-space. To avoid confusion, a new term "differential contrast microscopy" is introduced.

An operation for numerically returning the signum modulation of $k_x$-plane that is a characteristic of differential microscopy to the original state is now discussed. This is achieved by performing a multiplication operation of the following function on the Fourier-transformed image of the obtained image:

$$\frac{1}{2}\exp(isgn(k_x))\frac{\phi}{2} \quad (14)$$

This function form is multiplied with the intrinsic CTFs (4) and (5), resulting in the following CTFs:

$$\text{amplitude } CTF: \cos\left(\gamma(|\kappa|) + \frac{\phi}{2}\right) \quad (15)$$

$$\text{phase } CTF: -\sin\left(\gamma(|\kappa|) + \frac{\phi}{2}\right) \quad (16)$$

These CTFs are even functions unlike the CTFs of FIGS. 4a and 4b and do not exhibit conspicuous differential effects. Where $\phi = -\pi$ is substituted into Eqs. (15) and (16), the CTFs are changed into the following even functions:

$$\text{amplitude CTF: } \sin \gamma(|\kappa|) \quad (17)$$

$$\text{phase CTF: } \cos \gamma(|\kappa|) \quad (18)$$

These CTFs are nothing other than CTFs appearing in phase contrast microscopy using a Zernike phase plate (the above-cited Japanese Patent Application No. 2000-85493 filed by Nagayama and Danev; R. Danev and K. Nakayama, *Ultramicroscopy* 88 (2001) 243).

After this manner, a phase difference contrast image is reproduced by Fourier-transforming a differential contrast image and performing a multiplication processing of the function of Eq. (14) on the Fourier-transformed image.

Furthermore, the inventors of this application proposed a complex observational method (K. Nagayama, *J. Phys. Soc. of Jpn.* 68 (1999) 811; R. Danev and K. Nagayama, *J. Phys. Soc. of Jpn.* 70 (2001) 696). In the complex observational method, a complex image is obtained by combination between a phase difference contrast image and a normal electron microscope image concerning the same specimen. The phase difference contrast image is obtained in phase contrast microscopy.

According to the complex observational method, if the phase difference contrast image reproduced from the above-mentioned differential contrast image is combined with the normal electron microscope image concerning the same specimen, the complex image is obtained.

Other objects and features of the invention will appear in the course of the description thereof, which follows.

DESCRIPTION OF THE PREFERRED EMBODIMENTS

Embodiments of the present invention are hereinafter described.

Figure 6A:
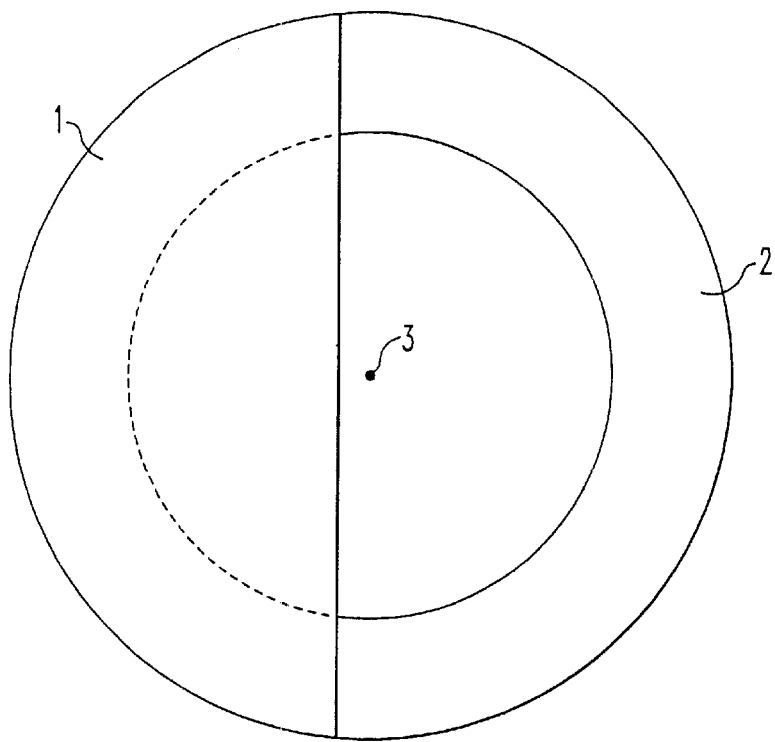
FIGS. 6a and 6b are diagrams illustrating the relation between a focus and a semicircular thin film forming a phase plate in differential contrast microscopy.
Figure 6B:
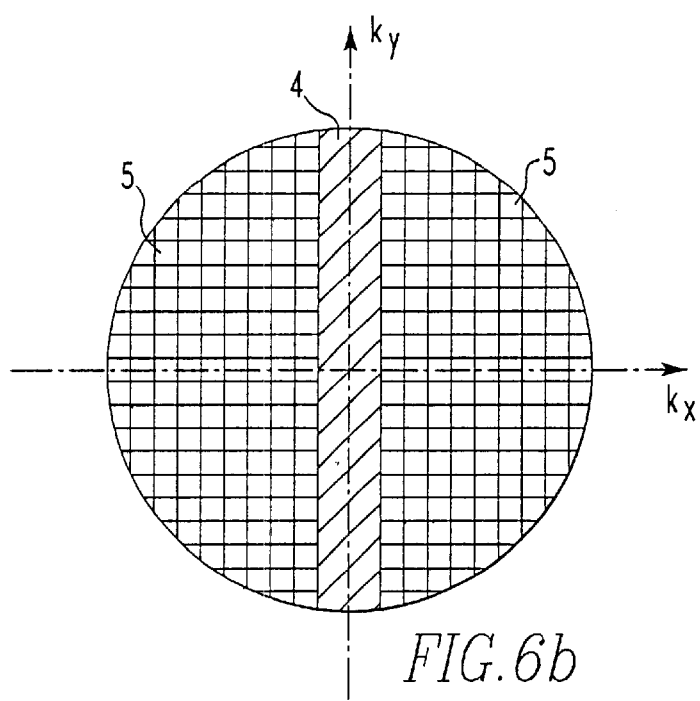

The results of specific experiments using differential electron microscopy are given below. FIGS. 6a and 6b show the relation between a focus and a semicircular thin film acting as a phase plate in differential contrast electron microscopy. Where the optical axis (3 in FIG. 6a) is at a considerable distance from the edge of the phase plate, differential contrast of low-frequency components cannot be expected. In this case, each different Fourier-transformed component provides a different level of contrast as shown in FIG. 6b, which is a schematic view illustrating coordinates ($k_x$, $k_y$) when the edges of the thin film (i.e., phase plate) are taken on the $k_y$-axis itself and the manner in which frequency components appear in CTFs. Area 4 provides the same contrast as in normal microscopy. In the case of phases, the CTF is of the sine type. Only area 5 provides differential contrast. In the case of phases, the CTF is of the cosine type. Therefore, the focus 3 is preferably made as close as possible to the edges of the thin film in practical applications.

Figure 7A:
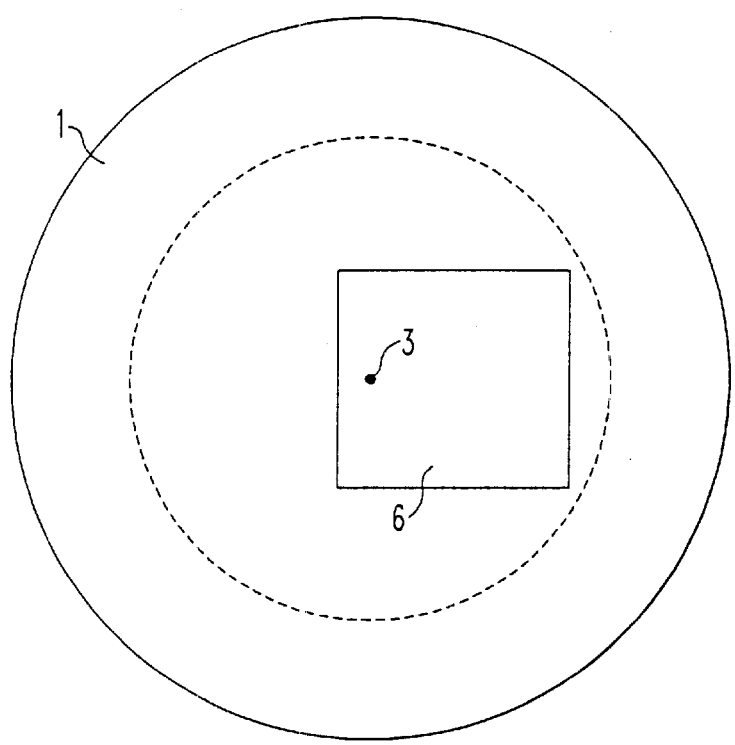
FIG. 7a is a top view of a phase plate made of a thin film and for use in differential contrast microscopy, the phase plate being provided with a square hole taking account of the mechanical stability of the thin film.

The semicircular phase plate assembly was fabricated by the sequence described below. First, an amorphous carbon film having a uniform thickness was prepared. This carbon film corresponds to a shift of $-\pi$ and is a thin film of about 60 nm. The carbon film was formed on a mica sheet by vacuum evaporation. Then, the carbon film was peeled off within water and floated off on water. This thin film of carbon was picked up with a single-hole grid of molybdenum. The whole single hole was covered with a carbon film. The sample was entered into a focused-ion beam system. A part of the thin film of carbon was cut off. More specifically, as shown in FIG. 7a, a square hole 6 was formed for the following reason. The thin film has a tension. If the film were cut as shown in FIG. 6a, the tension would be lost. The edges of the semicircular phase plate would bend. Straight edges would not be realized. Where the area of the square cutout portion is small compared with the area of the hole, the tension is maintained. The square edges will not bend.

Figure 7B:
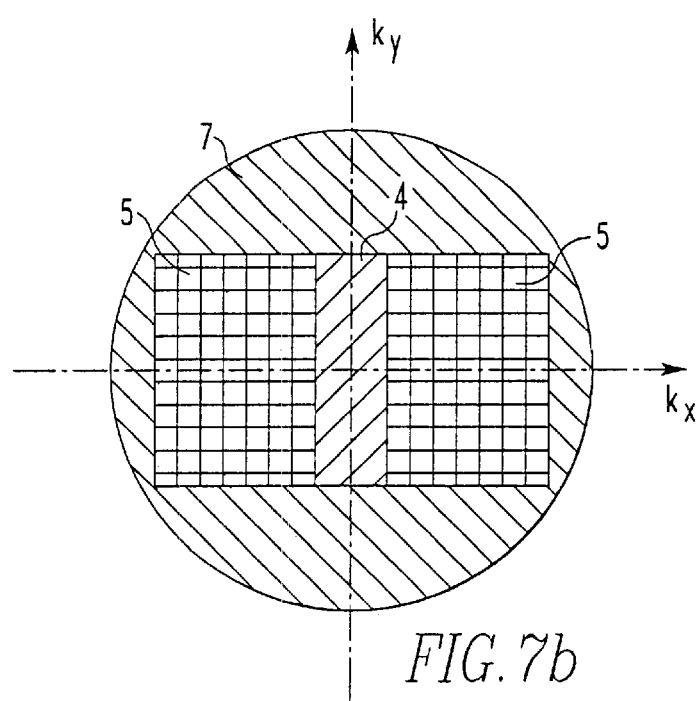
FIG. 7b is a diagram illustrating corresponding frequency-dependent contrast.
Figure 8C:
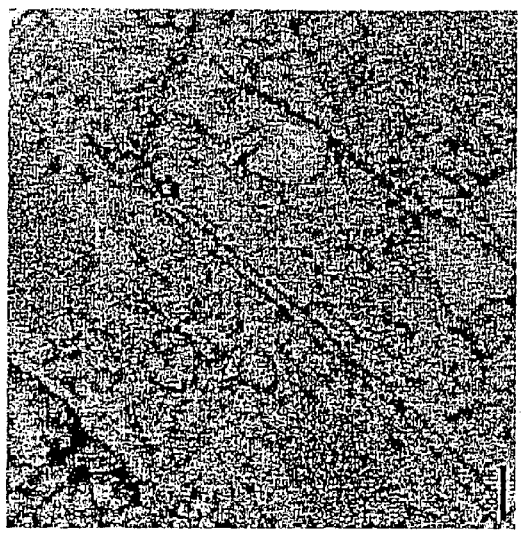
FIGS. 8a–8f show images of slices of cells of a nephric tube, and in which the images FIGS. 8a–8c have been taken by normal microscopy and the images FIGS. 8d–8f have been taken from the same areas by differential contrast microscopy.
Figure 8B:
Figure 8A:
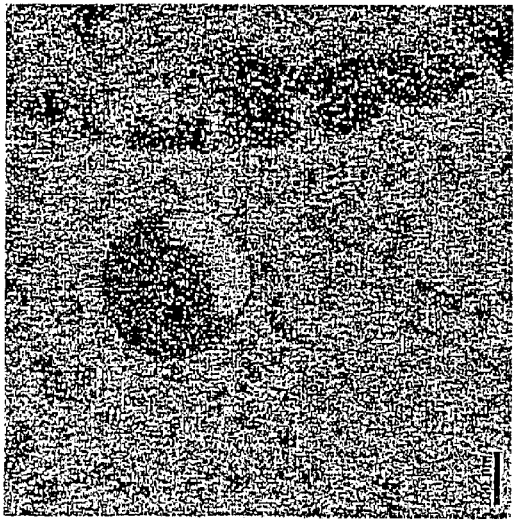
Figure 8F:
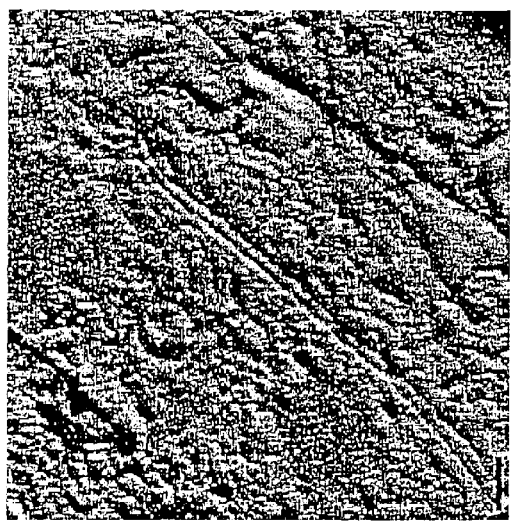
Figure 8E:
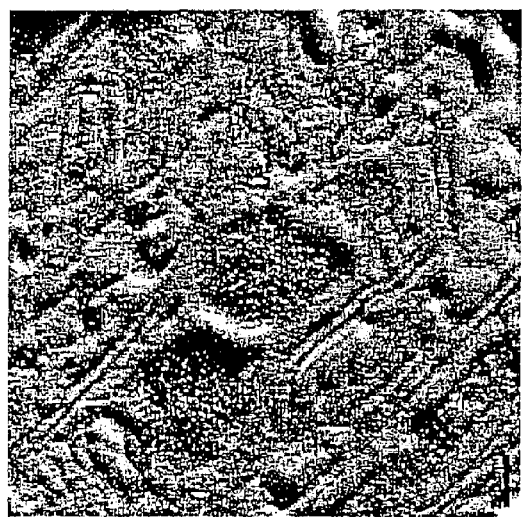
Figure 8D:
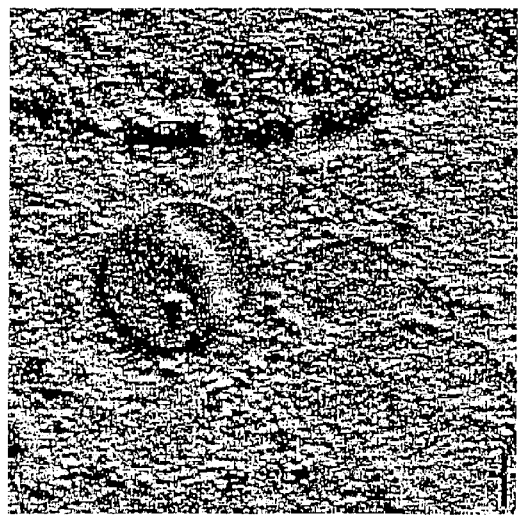

In this case, the frequency components of the k-space provide the following contrast. As shown in FIG. 7b, area 4 gives contrast of normal electron microscopy. Area 5 gives differential contrast. Area 7 gives contrast similar to contrast provided by a Zernike phase plate. That is, where $\phi$ is $-\pi 2$, phase-difference contrast results. Where $\phi=-\pi$ is, normal contrast results.

An example of a differential contrast image produced by a 300 kV electron microscope where the phase plate assembly shown in FIG. 7a is used is given below. The phase plate assembly is provided with an aperture having a diameter of 50 $\mu$m. A portion 20 $\mu$m square has been cut off. The relation $\phi=-\pi$ is used. The thickness of the thin film is 60 $\mu$m.

FIGS. 8a–8f show images of slices of cells of a nephric tube. The upper stage (FIGS. 8a, 8b, and 8c) shows an image produced by normal microscopy. The lower stage (FIGS. 8d–8f) shows an image of the same area by differential contrast microscopy. The sample that produced these images is stained by osmium fixation alone. Generally, this staining method is advantageous to hold the film tissue but the stain contrast is low. As shown at the upper stage (FIGS. 8a, 8b, and 8c), the contrast is so low that the image cannot be magnified in normal microscopy. The lower stage (FIGS. 8d, 8e, and 8f) shows an image of the same area taken by differential contrast microscopy. There are two distinct features. The first one is quite high contrast. The second one is a three-dimensional topographical imaging representation. These features are the same as those obtained where a transparent specimen is observed with a visible light differential interference contrast microscope. As a result, hyperfine structures of cell images can be decisively elucidated with unprecedentedly high degree of certainty and high resolution. For comparisons, a differential contrast image was first taken. Then, normal microscopy was performed. Therefore, we can assert that the topographical representation is not the effect of etching due to electron beam irradiation.

Figure 9A:
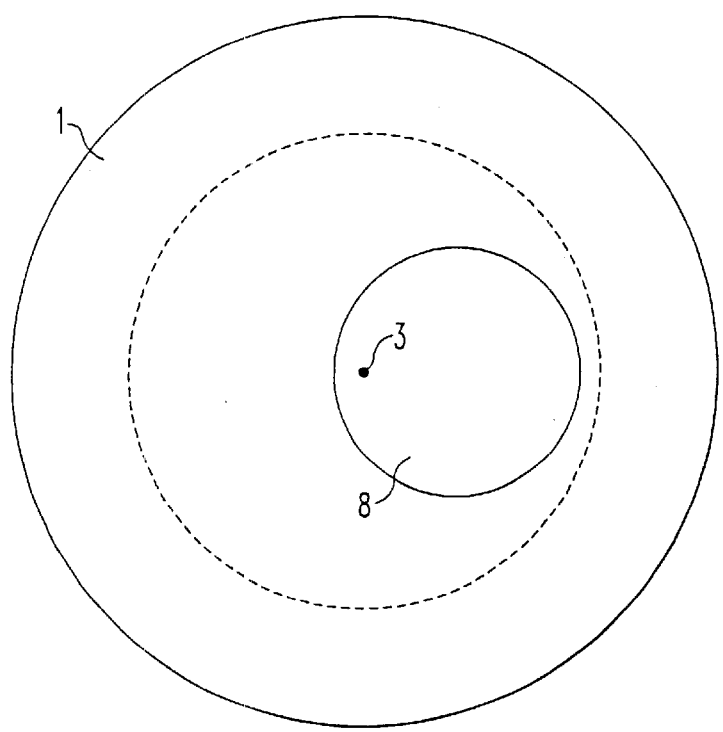
FIG. 9a and 9b show another example of phase plate for use in differential contrast microscopy, the phase plate being designed taking account of the mechanical stability of a thin film forming the phase plate.
Figure 9B:
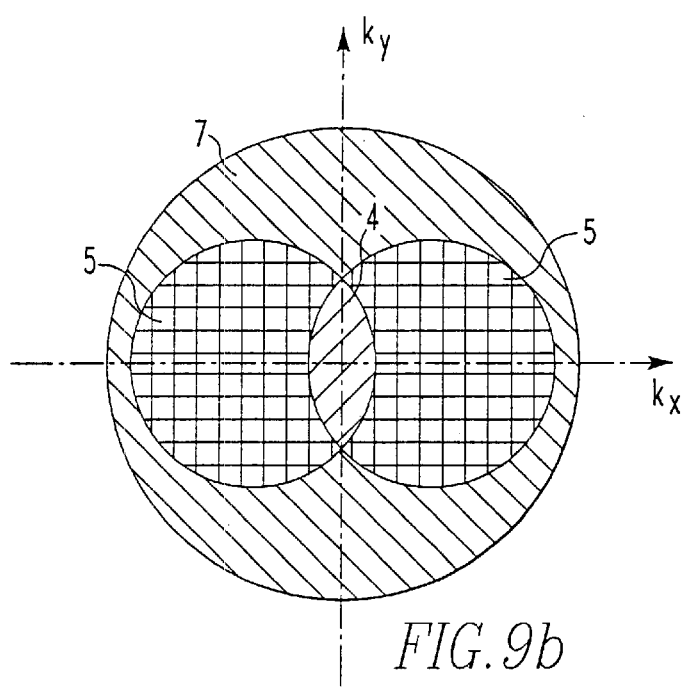

A circular portion may also be cut from the differential contrast microscopy phase plate, because greater stability is offered to the film, and because a wider differential area can be secured. This is schematically shown in FIG. 9a. A circular cutout 8 may contain the focus 3 very close to its edge. FIG. 9b shows the contrast distribution in a k-space. Area 4 is a normal image area. Area 5 is a differential contrast area. Area 7 is a contrast area equivalent to a Zernike phase plate.

Figure 10A:
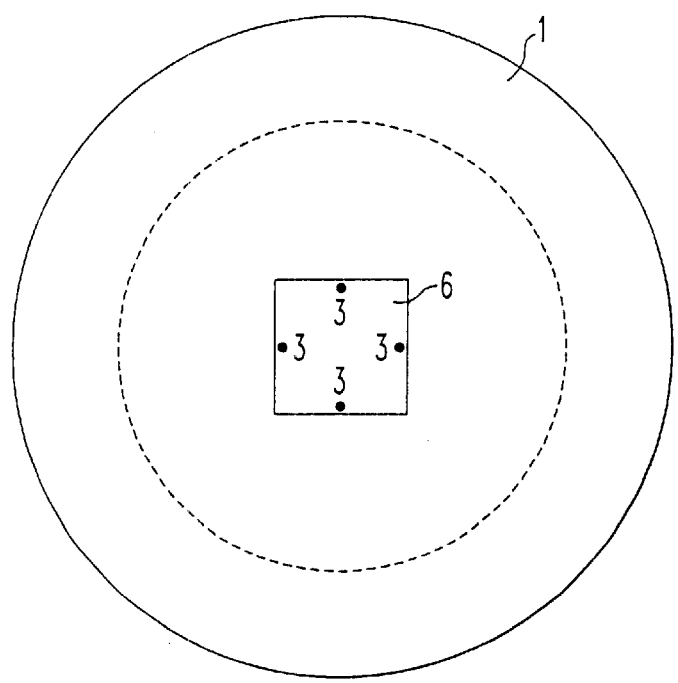
FIG. 10a shows one example of phase plate permitting one to select the differential direction (and thus the direction of light and shade of a topographical image) from four directions.
Figure 10B:
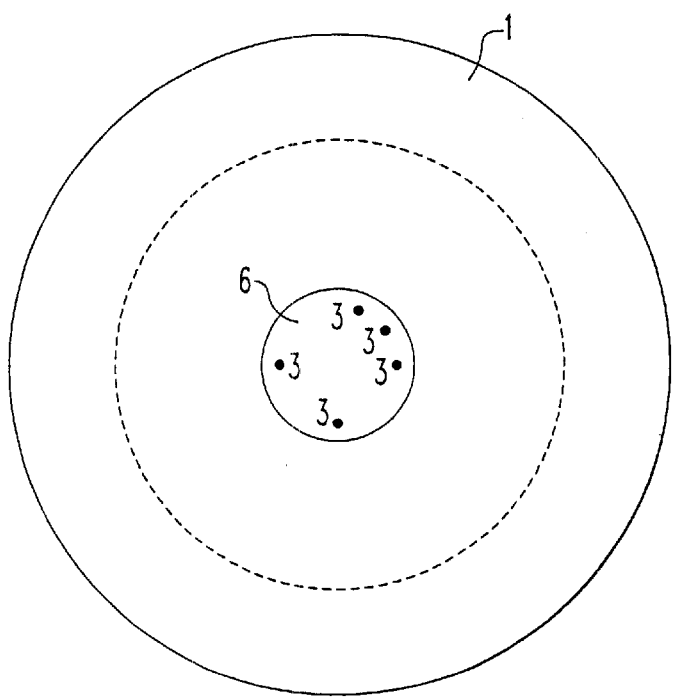
FIG. 10b is a top view of a phase plate permitting one to select the differential direction from any desired direction.

Furthermore, an aperture that is 1.5 times as wide as the aperture used in the microscopy shown in FIGS. 7a–7b and 8a–8f may also be used. A square or circular hole may be placed on the center of the aperture (FIGS. 10a and 10b). In the case of the square, the center of the beam may be placed close to the four edges. In the case of the circular hole, the beam center may be placed close to any arbitrary edge. Since the center position of the beam determines the direction of displacement, the direction of light and shade in the image can be set to four directions in the case of the square hole of FIG. 10a and to any arbitrary direction in the case of the circular hole of FIG. 10b.

In this way, in the present invention, operations can be performed on phases using a phase plate placed at the back focal plane of an objective lens. Thus, the amplitude and phase of a contrast transfer function are modulated. The phase delay is adjusted. In consequence, transformation into odd functions can be achieved. Hence, the image contrast of a phase object can be enhanced. Effects equivalent to those produced by differential interference contrast microscopy can be produced. In this way, a differential contrast microscope image can be obtained.

Figure 1:
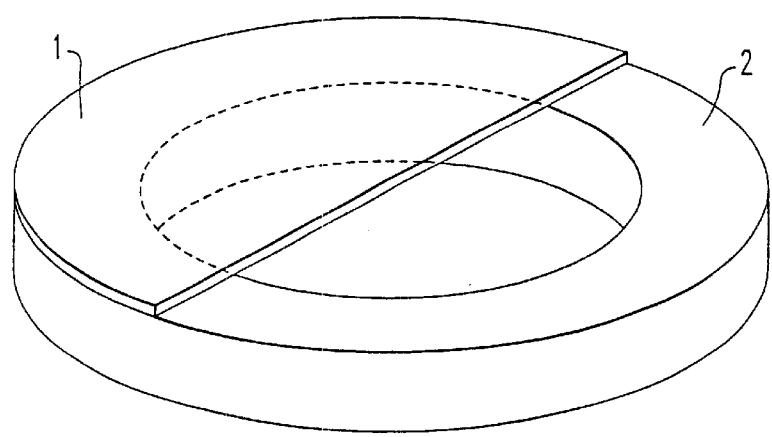
FIG. 1 is a perspective view of a semicircular phase plate according to the present invention.
Figure 3:
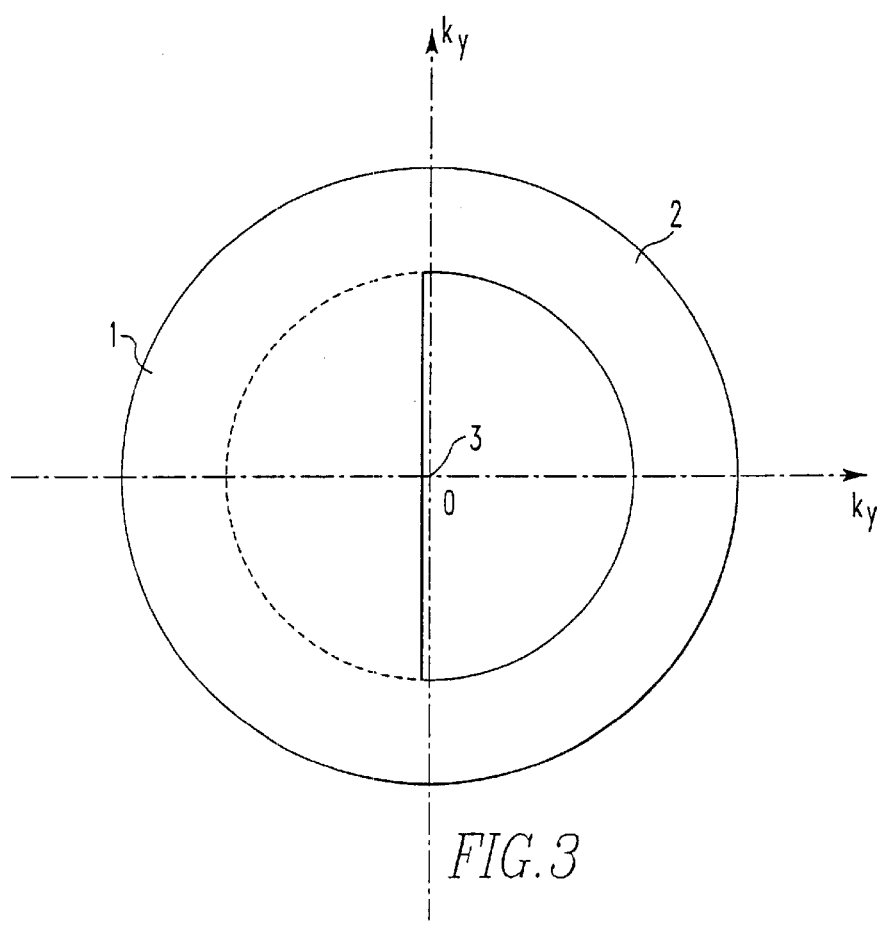
FIG. 3 is a diagram illustrating a system of coordinates set for a diffraction plane (focal plane) depending on a semicircular phase plate.
Figure 2A:
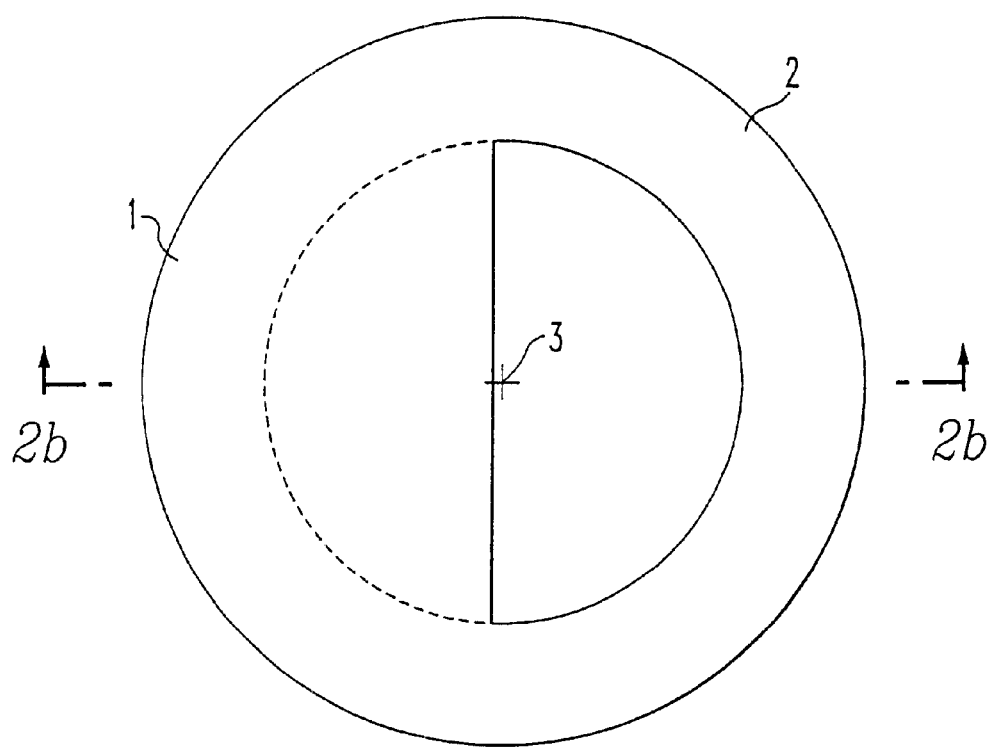
FIG. 2a is a plan view of the semicircular phase plate shown in FIG. 1.
Figure 2B:
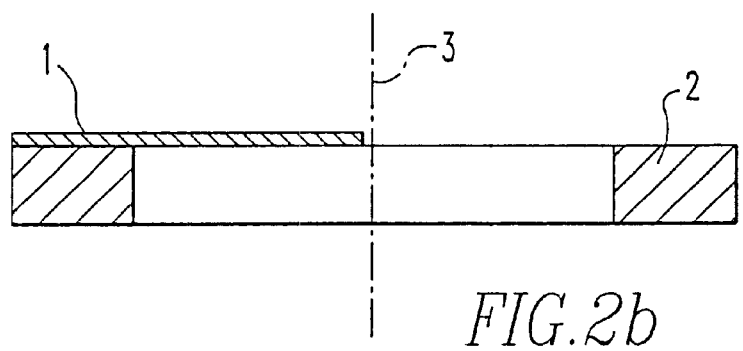
FIG. 2b is a side elevation of the semicircular phase plate shown in FIG. 1.
Figure 4A:
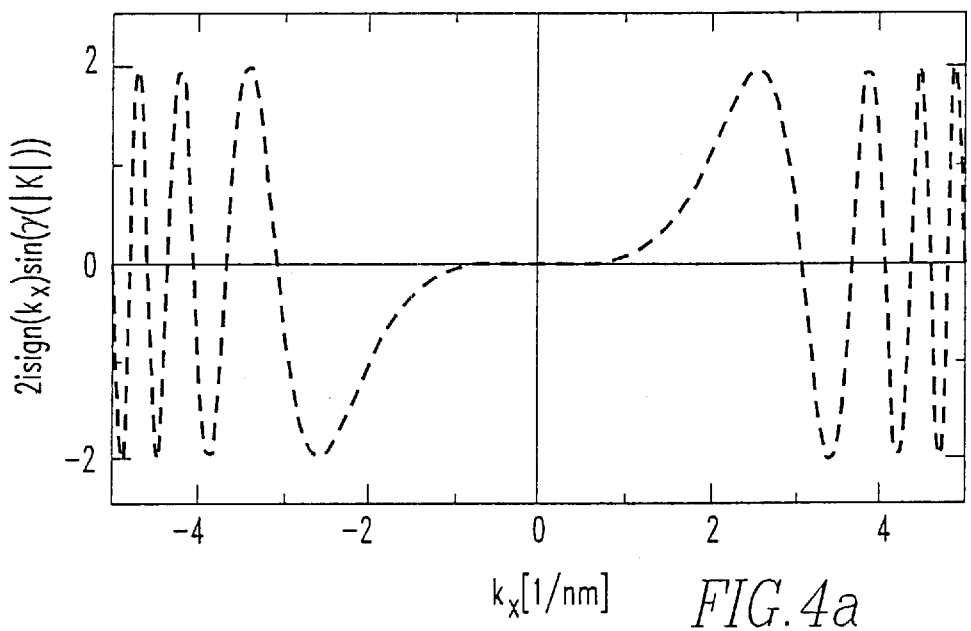
FIG. 4a is a diagram showing a CTF associated with amplitude.
Figure 4B:
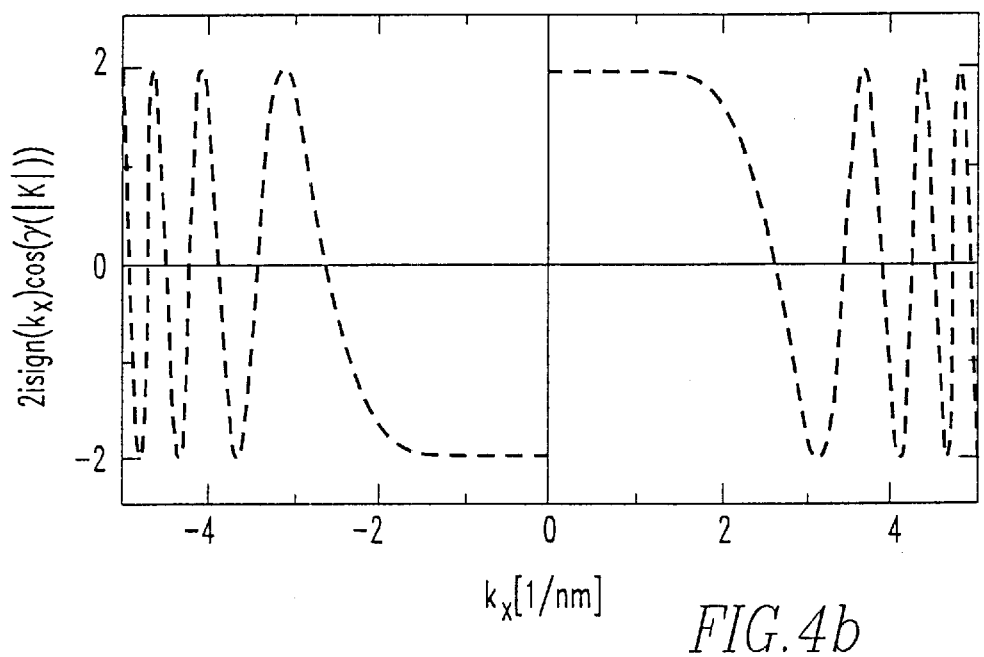
FIG. 4b is a diagram showing a CTF associated with phases.
Figure 5A:
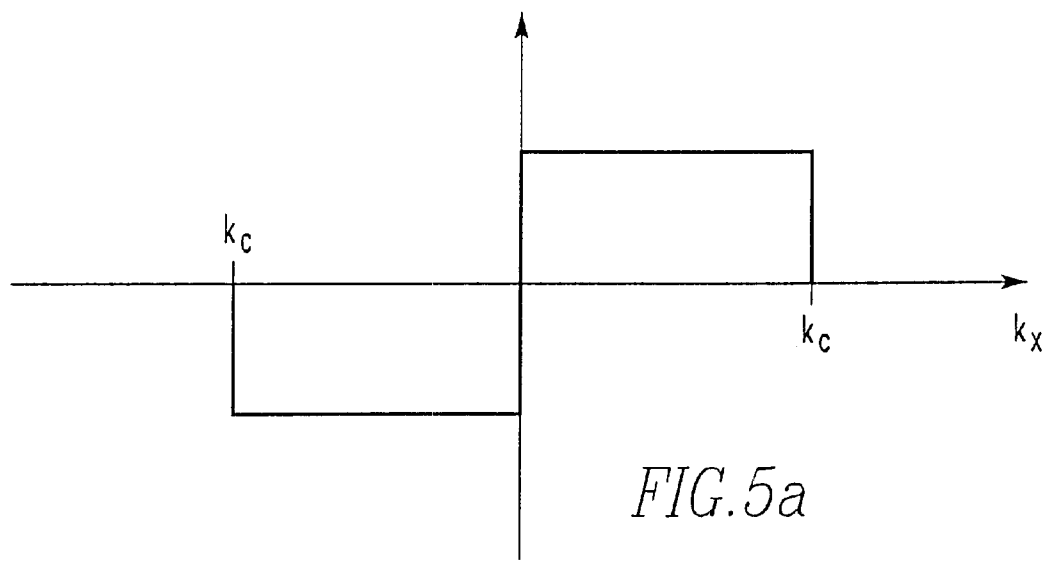
FIGS. 5a and 5b show ways of representing differential contrast where an approximate phase CTF is used.
Figure 5B:
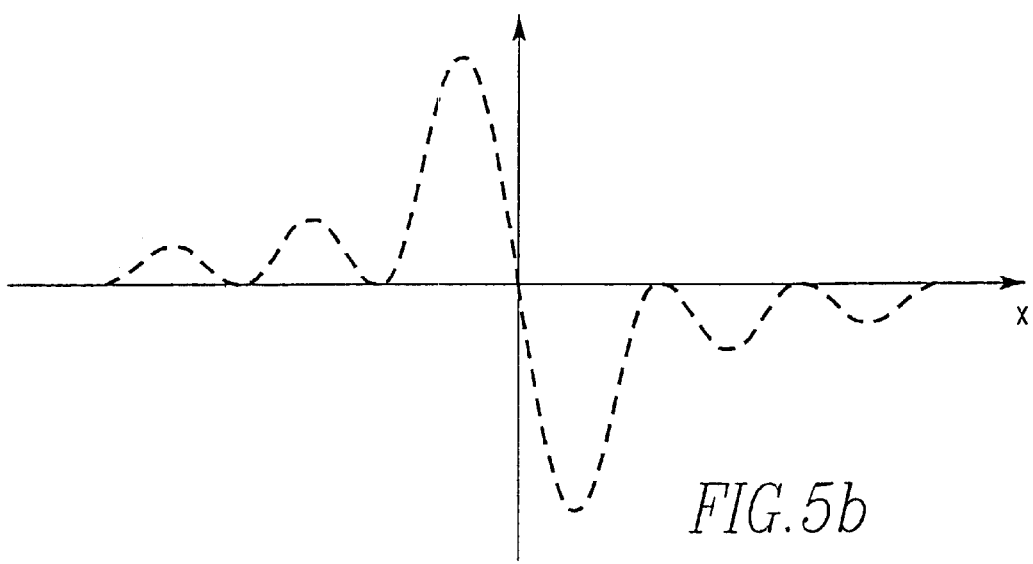
Figure 11:
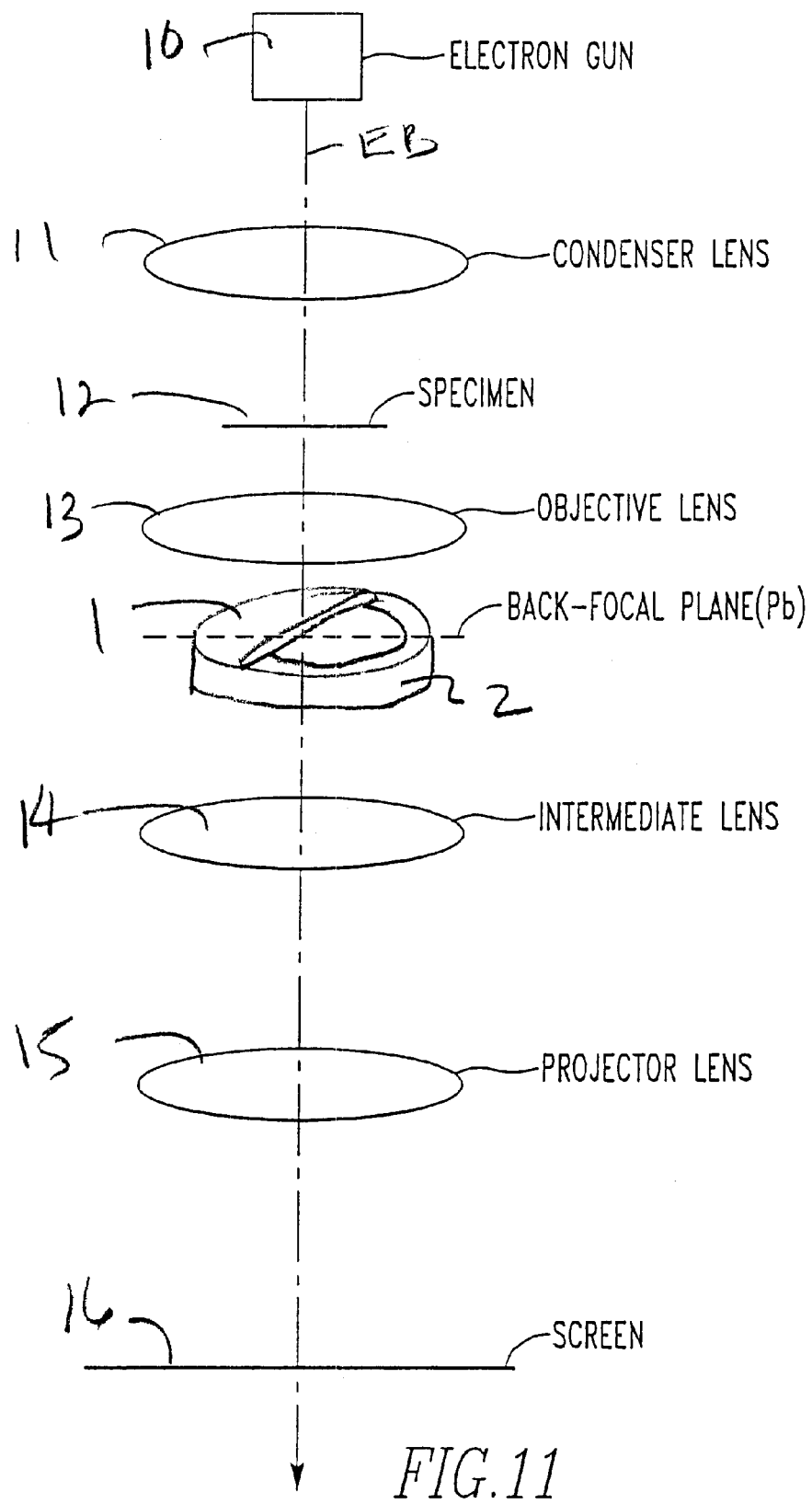
FIG. 11 is a diagram showing the structure of a transmission electron microscope.
Figure 12:
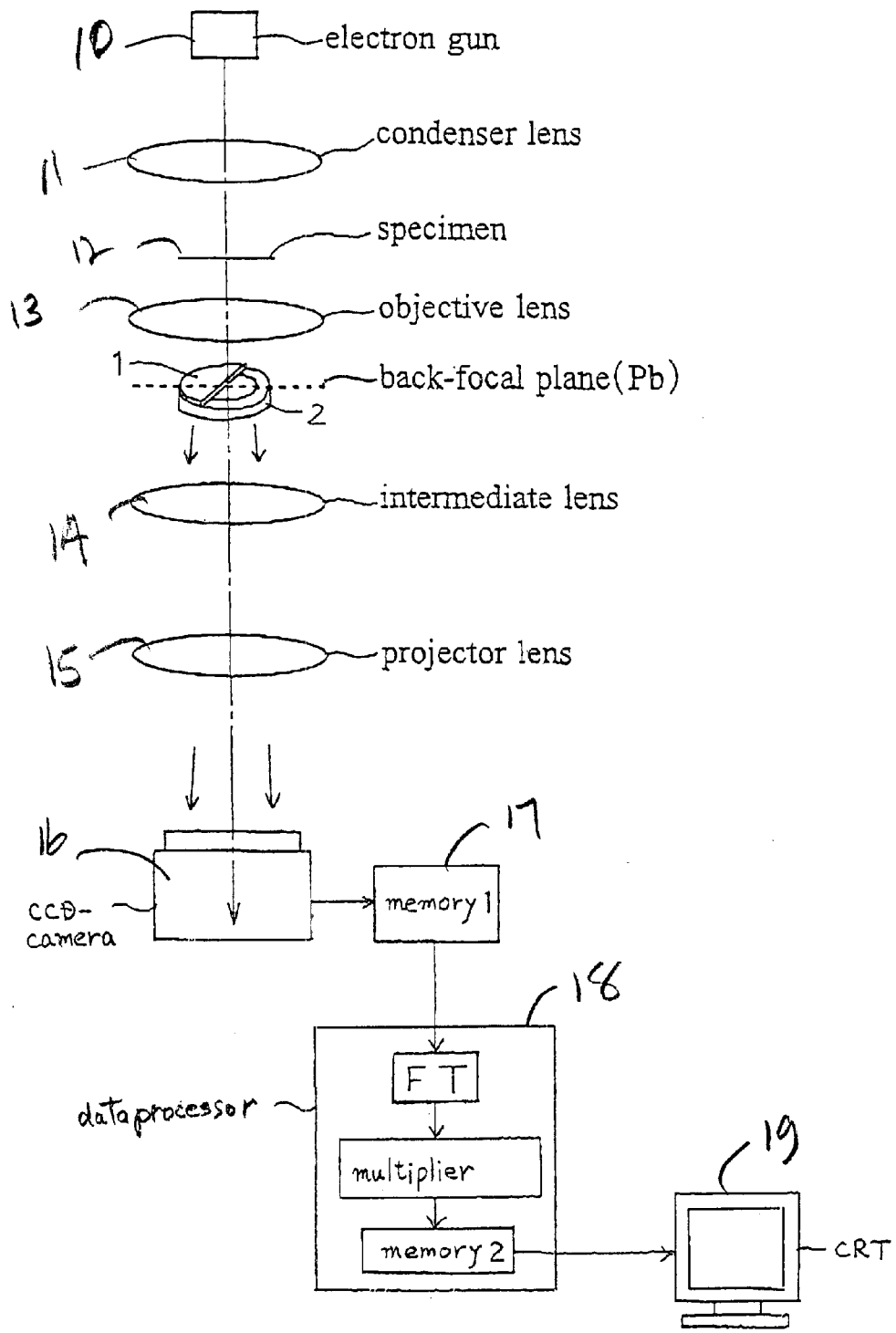
FIG. 12 is a diagram showing the structure of a transmission electron microscope and associated memory and data processor for display of an FT (Fourier-transform) image.
Figure 13:
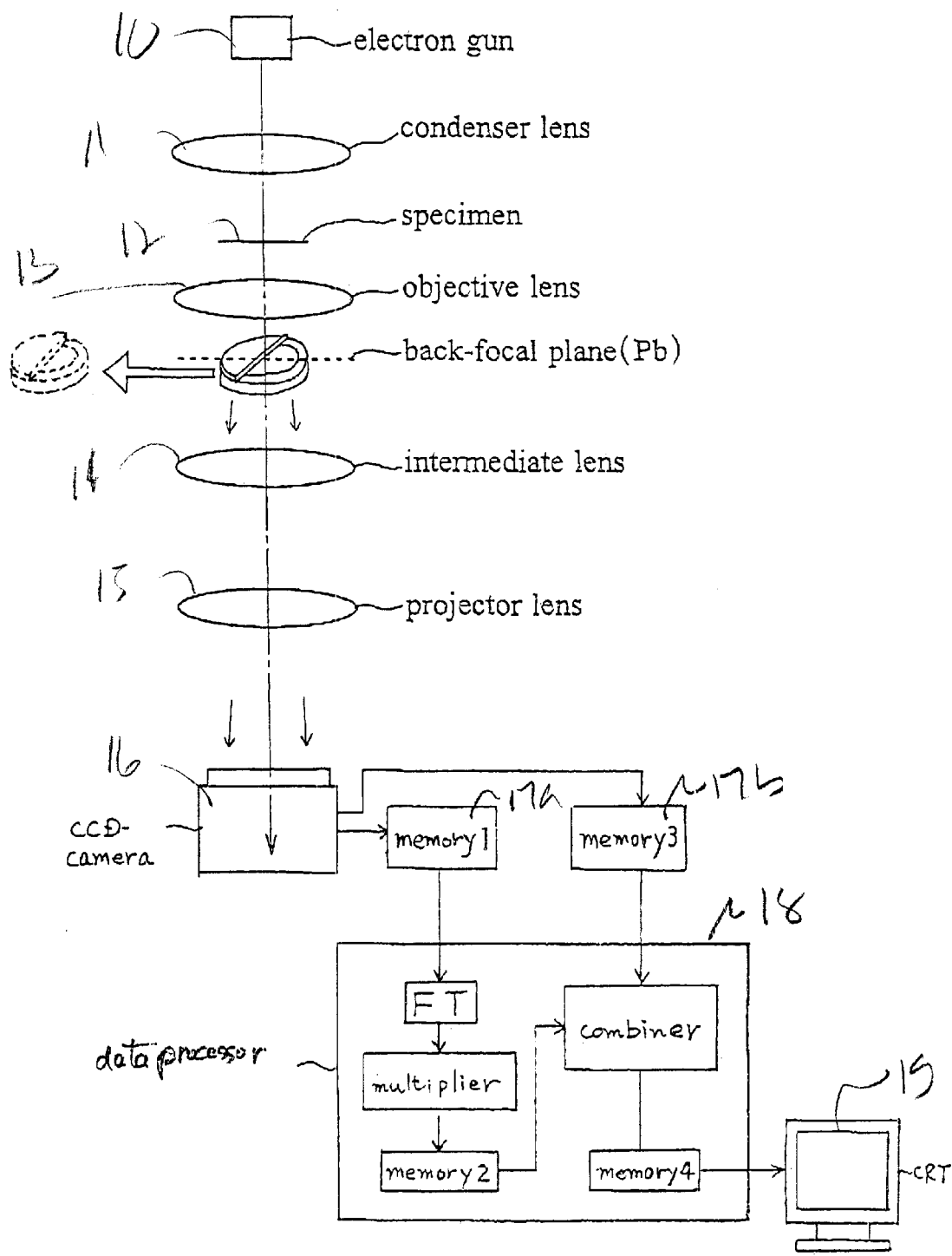
FIG. 13 is a diagram showing the structure of a transmission electron microscope and associated memories and data processor for displaying a combined FT (Fourier-transform) image and untransformed image.
Figure 11:
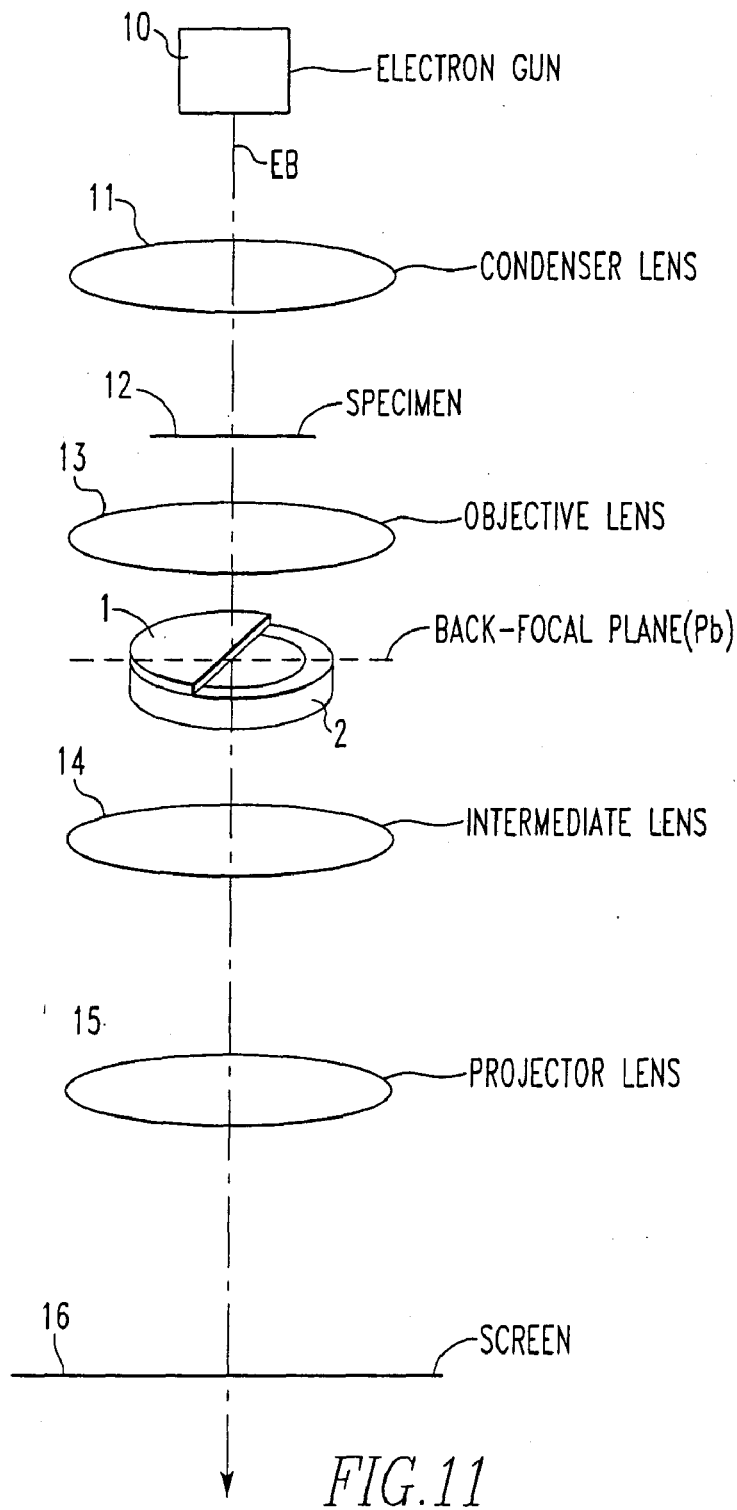
Figure 12:
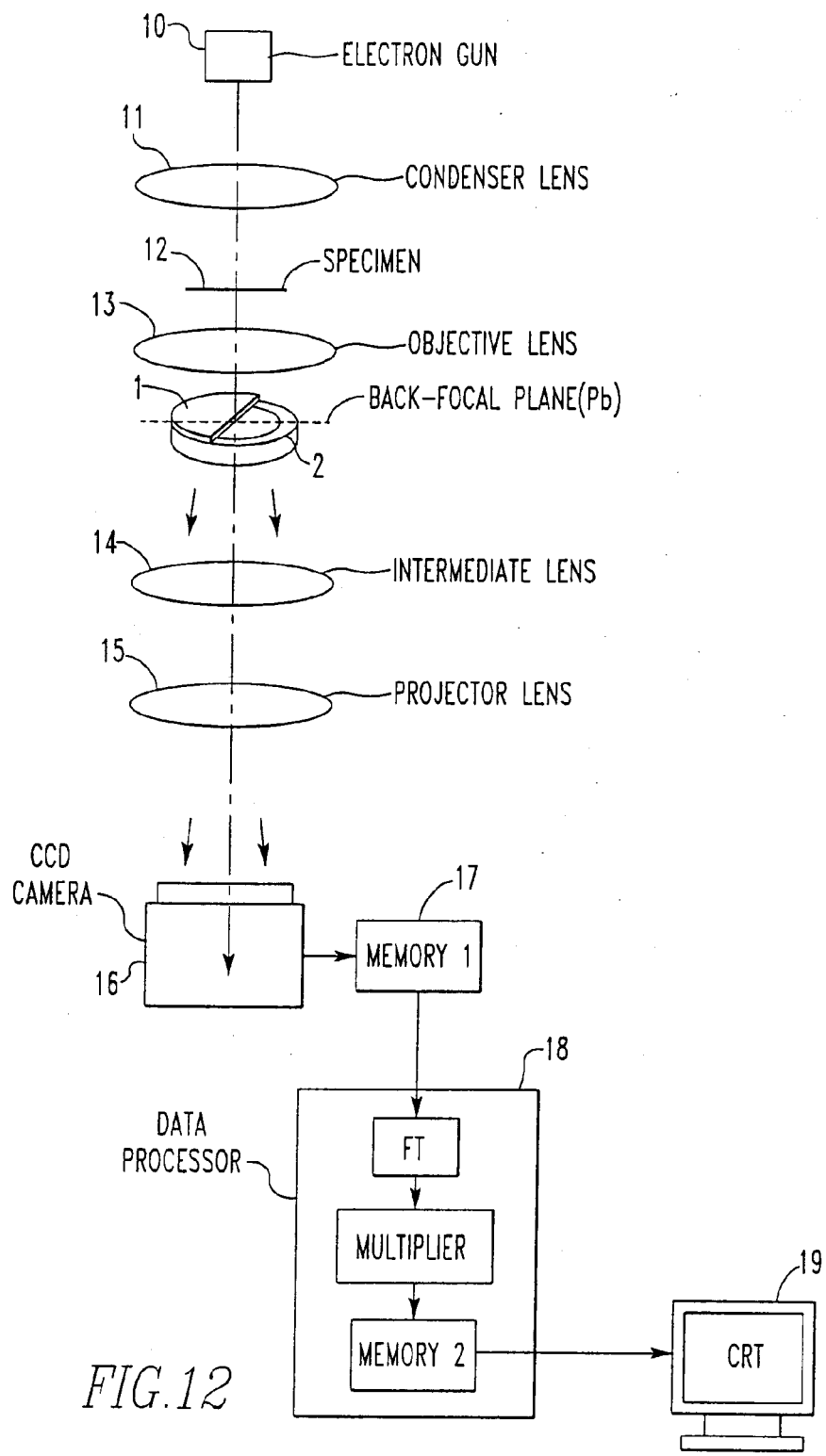
Figure 13:
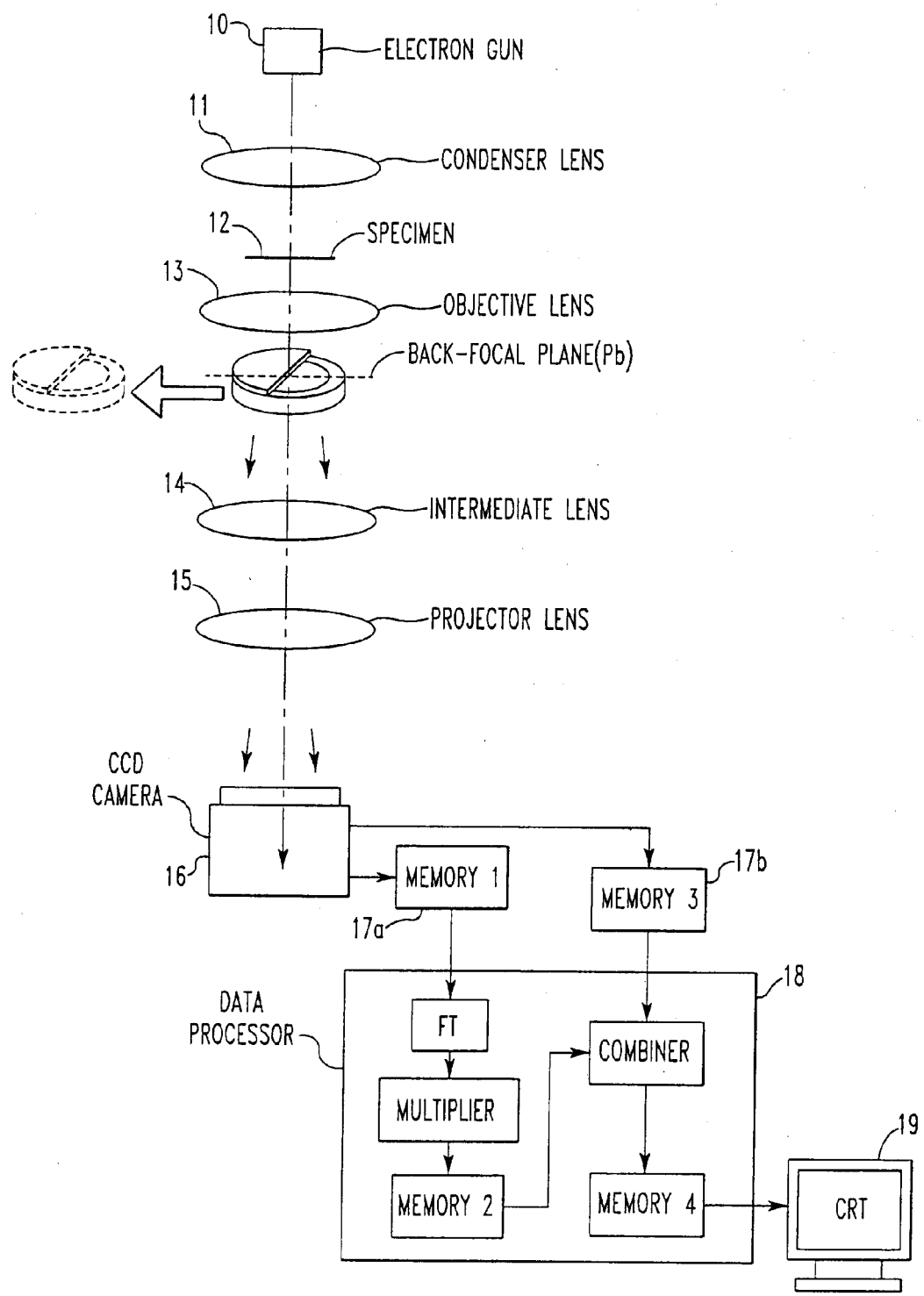

Referring to FIG. 11, there is shown a transmission electron microscope with a phase plate according to one embodiment of the present invention wherein the differential contrast image (as explained above) is obtained and displayed on a fluorescent screen without further processing. An electron beam EB is emitted from an electron gun 10. The beam is condensed by condenser lens 11 and focused on the transmission specimen 12. The beam transmitted through the specimen is phase delayed when passing some portions thereof. The transmitted beam is passed through the objective lens 13. At the back focal plane of the objective lens a phase plate 1, 2, as described with reference to FIG. 1, is located. The beam passing the phase plate is divided into two components, one phase delayed, if at all, by the specimen (if having passed through a dense location) and the phase plate and another phase delayed only by the phase plate. An intermediate lens 14 and projector lens 15 focus both components on the screen 16 where interference between the two components produces the differential contrast image. Referring now to FIGS. 12 and 13, there are shown transmission electron microscopes with CCD cameras for capturing an interference image and transferring the image to a frame memory. The elements identified with regard to FIG. 11 are identified with identical numbers.

According to the embodiment illustrated in FIG. 12, a phase difference contrast image can be produced from the CCD camera captured differential contrast image by Fourier-transforming the differential contrast image and performing a multiplication process according to the function of Eq. (14). The image captured by the CCD camera 16 is transferred to the computer memory 17 where it can be accessed by a data processor 18 which performs the Fourier-transform operation and multiplier operation on the image which is stored in the second memory for being read out to CRT 19 displaying a phase contrast image.

According to yet another embodiment of the present invention as illustrated in FIG. 13, the differential contrast image can be used to produce a complex image from a phase contrast image and a normal transmission electron microscope image as described in the articles identified above from the *Journal of Physics Society of Japan,* Vols. 68 and 70. The differential contrast image is produced with the phase plate in place and is stored in memory 17a. The phase plate is then drawn aside and the normal transmission image is obtained and stored in memory 17b. The images are both processed by data processor 18 and a complex image is displayed on the CRT 19.

Having thus described our invention with the detail and particularity require by the Patent Laws, what is desired protected by Letters Patent is set forth in the following claims.

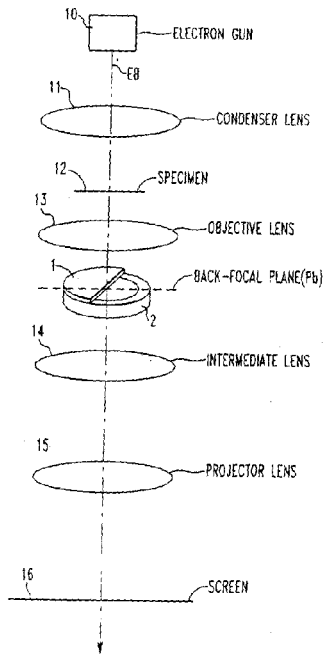

The invention claimed is:

1. A differential contrast transmission electron microscope comprising:

an objective lens having a back focal plane; and a phase plate placed in said back focal plane for forming odd functions of contrast transfer functions of electron waves in back of said phase plate, thus obtaining a differential contrast image.

2. The differential contrast transmission electron microscope of claim 1, wherein said differential contrast image is obtained from electrons transmitting through said phase plate and electrons passing through the opening of said phase plate.

3. The differential contrast transmission electron microscope of claim 1, wherein said phase plate is a semicircular phase plate acting to delay phases by $\pi$.

4. The differential contrast transmission electron microscope of claim 1, wherein said phase plate acts to delay phases by $\pi$ and consists of a thin film acting as a phase plate, said thin film having a square cutout portion, said thin film providing full cover over an aperture hole having a center, and wherein said square cutout portion is so positioned that its edge overlaps the center of the aperture.

5. The differential contrast transmission electron microscope of claim 1, wherein, said phase plate acts to delay phases by $\pi$ and consists of a thin film acting as a phase plate, said thin film having a circular cutout portion, said thin film providing full cover over an aperture hole having a center, and wherein said circular cutout portion is so positioned that its edge overlaps the center of the aperture.

6. The differential contrast transmission electron microscope of any one of claims 3 to 5, wherein a spatial displacement produced between an optical axis and an edge of said phase plate to create differential contrast is controlled in terms of degree of defocus.

7. A method of observing a differential contrast image having an objective lens forming a back focal plane, said method comprising of:

placing a phase plate in said back focal plane, said phase plate forming odd functions of contrast transfer functions of electron waves in back of said phase plate.

8. A method of processing data about an electron microscope image, comprising the steps of:

Fourier-transforming an image obtained by the electron microscope of any one of claims 1 to 5; and performing processing for nullifying phase delay introduced by said phase plate, whereby a phase contrast image is reproduced.

9. A method of processing data about an electron microscope image, comprising the steps of:

obtaining a phase contrast image from a specimen as set forth in claim 8;

obtaining a normal electron microscope image from the same specimen; and combining said phase difference contrast image and said normal electron microscope image to create a complex image.

* * * * *

UNITED STATES PATENT AND TRADEMARK OFFICE
CERTIFICATE OF CORRECTION

PATENT NO. : 6,674,078 B2
DATED : January 6, 2004
INVENTOR(S) : Kuniaki Nagayama et al.

It is certified that error appears in the above-identified patent and that said Letters Patent is hereby corrected as shown below:

Please delete Title page illustrative figure and substitute therefor the attached title page.

Please replace Figs. 11, 12 and 13 with the attached Figs. 11, 12 and 13 --.

Title page,
Item [56], References Cited, FOREIGN PATENT DOCUMENTS, insert
-- JP    2000-085493    3/2000 --.
OTHER PUBLICATIONS, insert
-- "Transmission Electron Microscopy: Physics of Image Formation and Microanalysis", Ludwig Reimer, Ed. 4, Springer, New York 1997, pages 245, 247.
"Transmission Electron Microscopy With Zernike Phase Plate", Radostin Danev et al, Ultramicroscopy 88, (2001), pages 243-252.
"Complex Observation in Electron Microscopy. I. Basic Scheme to Surpass the Scherzer Limit", Kumiaki NAGAYAMA, *Journal of the Physical Society of Japan*, Vol. 68, No. 3, March 1999, pages 811-822.
"Complex Observation in Electron Microscopy. II. Direct Visualization of Phases and Amplitudes of Exit Wave Functions", Radostin Danev et al., *Journal of the Physical Society of Japan*, Vol. 70, No. 3, March 2001, pages 696-702. --.

Signed and Sealed this

Eighteenth Day of October, 2005

JON W. DUDAS
*Director of the United States Patent and Trademark Office*

(12) United States Patent
Nagayama et al.

(10) Patent No.: US 6,674,078 B2
(45) Date of Patent: Jan. 6, 2004

(54) DIFFERENTIAL CONTRAST TRANSMISSION ELECTRON MICROSCOPE AND METHOD OF PROCESSING DATA ABOUT ELECTRON MICROSCOPE IMAGES

(75) Inventors: Kuniaki Nagayama, 2-5-1-13, Tatsumi-Minami, Okazaki, Aichi 444-0874 (JP); Radostin S. Danev, Aichi (JP)

(73) Assignees: Jeol Ltd., Tokyo (JP); Kuniaki Nagayama, Okazaki (JP)

( * ) Notice: Subject to any disclaimer, the term of this patent is extended or adjusted under 35 U.S.C. 154(b) by 0 days.

(21) Appl. No.: 10/255,163

(22) Filed: Sep. 25, 2002

(65) Prior Publication Data

US 2003/0066964 A1 Apr. 10, 2003

(30) Foreign Application Priority Data

Sep. 25, 2001 (JP) .................................. 2001-290860

(51) Int. Cl.$^7$ ................................. H01J 37/26
(52) U.S. Cl. ..................... 250/311; 250/306; 250/307; 356/128; 356/904
(58) Field of Search ............................... 250/311, 306, 250/307; 356/128, 904

(56) References Cited

U.S. PATENT DOCUMENTS

2002/0086317 A1 * 7/2002 Nagayama .................. 435/6
2002/0148962 A1 * 10/2002 Hosokawa et al. ......... 250/311
2003/0132383 A1 * 7/2003 Benner ...................... 250/311

FOREIGN PATENT DOCUMENTS

JP        2110-273866    * 5/2001

OTHER PUBLICATIONS

"Experiment on the Electron Phase Microscope", Kōichi Kanaya et al., *Journal of Applied Physics*, vol. 29, No. 1, pp. 1046–1051, Jul. 1958.
"High Resolution Electron Microscopy With Profiled Phase Plates", D. Willasch, *Optik*, vol. 44, No. 1, pp. 17–36 (1975).

* cited by examiner

*Primary Examiner*—John R. Lee
*Assistant Examiner*—James J. Leybourne
(74) *Attorney, Agent, or Firm*—Webb Ziesenheim Logsdon Orkin & Hanson, P.C.

(57) ABSTRACT

Phase manipulation is used to produce a high contrast electron microscope image. A phase plate is placed at the back focal plane of an objective lens and used to form a differential contrast image.

9 Claims, 13 Drawing Sheets